United States Patent
Huang et al.

(10) Patent No.: US 7,728,374 B2
(45) Date of Patent: Jun. 1, 2010

(54) EMBEDDED MEMORY DEVICE AND A MANUFACTURING METHOD THEREOF

(75) Inventors: Ming-Yen Huang, Taipei (TW); Wen-Hung Wu, Taipei (TW)

(73) Assignee: Ali Corporation, Taipei (TW)

( * ) Notice: Subject to any disclaimer, the term of this patent is extended or adjusted under 35 U.S.C. 154(b) by 0 days.

(21) Appl. No.: 12/142,148

(22) Filed: Jun. 19, 2008

(65) Prior Publication Data

US 2009/0236649 A1   Sep. 24, 2009

(30) Foreign Application Priority Data

Mar. 24, 2008   (CN) .................... 2008 1 0086334

(51) Int. Cl.
*H01L 27/108* (2006.01)
*H01L 21/8242* (2006.01)

(52) U.S. Cl. ..................... 257/306; 438/253

(58) Field of Classification Search ............. 365/49.2, 365/49.12, 149, 232; 257/368, 288, 213, 257/68, 666, 71, 296, 298, 300, 303, 532, 257/904, E21.65, E27.013, E27.027, E27.05, 257/306; 438/197, 216, 240, 261, 253; 327/143; 361/56, 18, 301.1, 306.1, 308.2, 306.3

See application file for complete search history.

(56) References Cited

U.S. PATENT DOCUMENTS

| | | | |
|---|---|---|---|
| 6,876,059 B2 * | 4/2005 | Sano .................... | 257/532 |
| 2006/0226462 A1 * | 10/2006 | Ota ................... | 257/298 |
| 2007/0034988 A1 * | 2/2007 | Won et al. ............. | 257/532 |
| 2007/0268653 A1 * | 11/2007 | Kim et al. ............. | 361/328 |

* cited by examiner

*Primary Examiner*—Thomas L Dickey
*Assistant Examiner*—Nikolay Yushin
(74) *Attorney, Agent, or Firm*—Rosenberg, Klein & Lee

(57) ABSTRACT

An embedded memory device solves the problem of the low reliability of the circuit due to the unstable power source. The embedded memory includes a metal-oxide semiconductor (MOS) capacitor and a metal-insulator-metal (MIM) capacitor to increase the stability of the power source ring to stabilize the voltage of the embedded memory and stabilize the voltage for the peripheral circuit of the embedded memory.

10 Claims, 3 Drawing Sheets

EMBEDDED MEMORY DEVICE AND A MANUFACTURING METHOD THEREOF

BACKGROUND OF THE INVENTION

1. Field of the Invention

The present invention relates to an embedded memory device. In particular, this invention relates to an embedded memory device and a manufacturing method thereof that uses an integrated circuit manufacturing process to enhance stability of the voltage.

2. Description of the Related Art

For the industrial technology, an electronic system can be integrated into a single chip—named as system on chip (SOC). The SOC is manufactured by an integrated circuit manufacturing process, and the SOC is composed of a processor, an embedded memory, a variety of peripheral interfaces and external bus interfaces. During the evolution of technology, the development of SOC let the system designer can reduce the dimension occupied by the electronic system and the testing time. The reliability of the SOC is enhanced, and the developing time of the SOC is reduced.

The embedded memory is an important electronic element for the SOC. Reference is made to FIGS. 1A and 1B. FIG. 1A is a top view of the circuit layout of the embedded memory of the prior art. FIG. 1B is a cross-sectional view of the circuit layout of the embedded memory of the prior art. In FIG. 1A, the embedded memory circuit includes a core circuit 10, a grounding ring 12, and a power ring 14. From FIG. 1B, the core circuit 10 is composed of an ion distributing layer 100, a polysilicon layer 102, a first metal layer 104, a second metal layer 106, a third metal layer 108, and a fourth metal layer 110.

In SOC, because the change of operation status of the integrated circuit and the influence of the coupled capacitors between circuits, the power source oscillates varying. The unstable power source makes the voltage exceeded the range of the timing model and then the reliability of the circuit is reduced. As the circuit is developed to the deep sub-micron, the oscillation of the power source will probably make the transistor operates deviated from the normal saturation area, and the circuit function is failed. In the deep sub-micro of SOC, the dimension of the embedded memory occupies the chip area becoming higher. Therefore, the stable power source can increase the stability of the embedded memory, so that the yield rate of the SOC increases.

SUMMARY OF THE INVENTION

In order to solve the problem of the power source being unstable in the embedded memory of the prior art, a device for enhancing the stability of the power source of the embedded memory in integrated circuit and a method are disclosed.

One particular aspect of the present invention is to enhance the stability of the power source of the embedded memory in integrated circuit, without changing the circuit layout of the SOC.

The device for enhancing the stability of the power source of the embedded memory in integrated circuit includes a core circuit, a metal-oxide semiconductor (MOS) capacitor, and a metal-insulator-metal (MIM) capacitor. One end of the core circuit is connected with a power source ring, and a second end of the core circuit is connected with a grounding ring. The metal-oxide semiconductor (MOS) capacitor is connected with the power source ring, and is in parallel with the core circuit. The metal-insulator-metal (MIM) capacitor is connected with the power source ring, and is in parallel with the core circuit and the MOS capacitor. Thereby, by utilizing the metal-oxide semiconductor (MOS) capacitor and the metal-insulator-metal (MIM) capacitor, the stability of the power source is enhanced.

The present invention also provides a layout method for enhancing the stability of the power source of the embedded memory. The embedded memory includes a first metal layer, a polysilicon layer, an ion distributing layer, a fourth metal layer, a second metal layer and a third metal layer. The layout method includes forming a core circuit on the first metal layer, the polysilicon layer, the ion distributing layer, the second metal layer, the third metal layer and the fourth metal layer. A grounding ring and a power source ring are patterned on an additional area of the fourth metal layer. At least one metal-oxide semiconductor (MOS) capacitor is located below the grounding ring and the power source ring. A metal-insulator-metal (MIM) capacitor is formed between the fifth metal layer and the sixth metal layer.

By adding the metal-oxide semiconductor (MOS) capacitor and the metal-insulator-metal (MIM) capacitor into the embedded memory, the stability of the power source ring is enhanced, and the voltage of the embedded memory is stabilized. Furthermore, the power source for the peripheral circuit of the embedded memory is also stabilized. The reliability of the SOC is enhanced.

For further understanding of the invention, reference is made to the following detailed description illustrating the embodiments and examples of the invention. The description is for illustrative purpose only and is not intended to limit the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

In SOC, an unstable power source will reduce the reliability of the circuit. As the circuit manufacturing process has been developed to the deep sub-micron, the oscillation range of the power source may make the transistor depart from the saturation area of a normal operation so that the circuit function fails. In a deep sub-micron chip, the dimension of the embedded memory occupied the chip area becomes more and more large. A stable power source will enhance the reliability of the embedded memory and increase the yield rate of the chips. The present invention provides an embedded memory structure that can improve the reliability of the embedded memory affected by the unstable power source, and prevent the data from damaged.

Figure 1A:
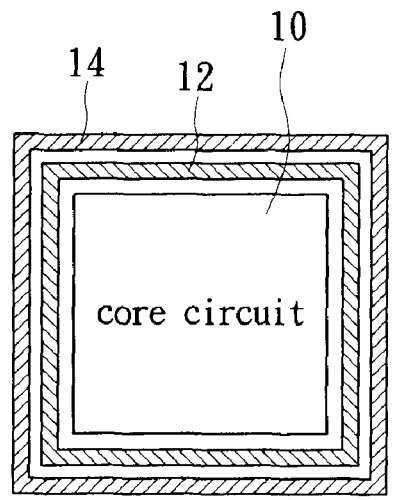
FIG. 1A is a top view of the circuit layout of the embedded memory of the prior art.
Figure 1B:
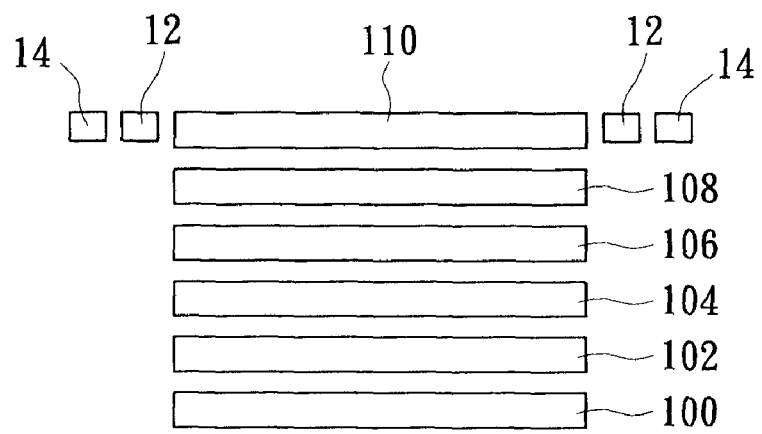
FIG. 1B is a cross-section view of the circuit layout of the embedded memory of the prior art.
Figure 2A:
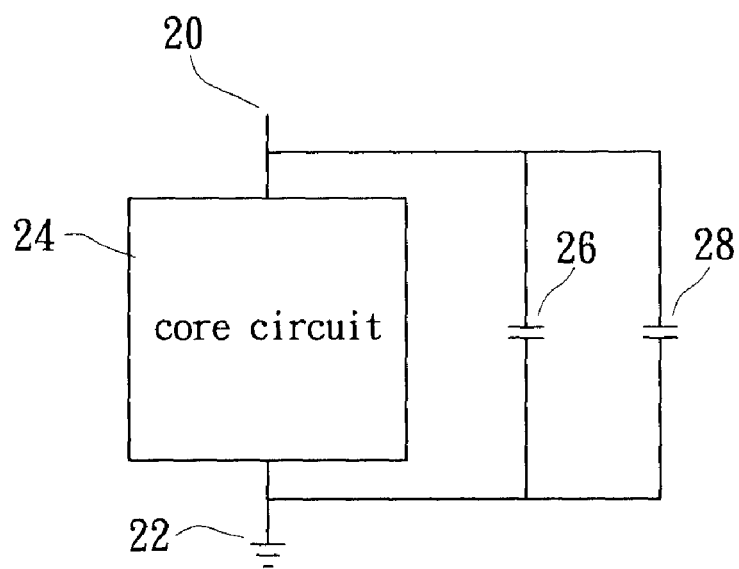
FIG. 2A is a schematic diagram of the embedded memory of an embodiment of the present invention.
Figure 2B:
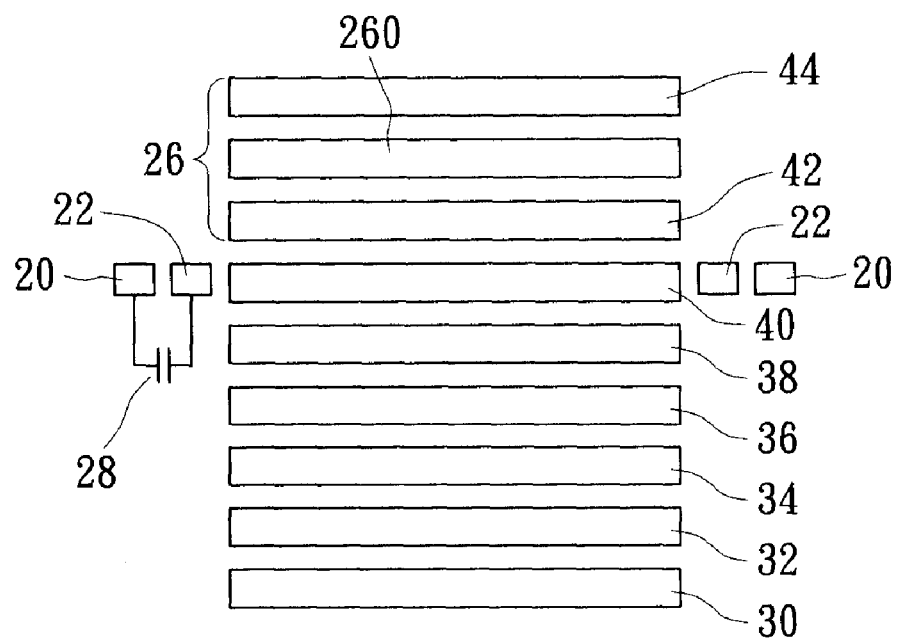
FIG. 2B is a cross-section view of the circuit layout of the embedded memory of an embodiment of the present invention.

Reference is made to FIGS. 2A and 2B. FIG. 2A is a schematic diagram of the embedded memory of an embodiment of the present invention. FIG. 2B is a cross-section view of the circuit layout of the embedded memory of an embodiment of the present invention. The embedded memory device includes a power source ring 20, a grounding ring 22, a core circuit 24, a metal-insulator-metal capacitor 26 and a MOS (metal-oxide-semiconductor) capacitor 28. The core circuit 24 is surrounded by the grounding ring 22 and the power source ring 20 in turn. The metal-insulator-metal capacitor 26 is formed above the core circuit 24, and the MOS capacitor 28 is formed under the grounding ring 22 and the power source ring 20.

According to FIG. 2B, the layout of the embedded memory is manufactured by the integrated circuit manufacturing process, and the embedded memory includes an ion distributing layer 30, a polysilicon layer 32, a first metal layer 34, a second metal layer 36, a third metal layer 38, a fourth metal layer 40, a fifth metal layer 42, and a sixth metal layer 44.

The core circuit 24 is formed by stacking the ion distributing layer 30, the polysilicon layer 32, the first metal layer 34, the second metal layer 36, the third metal layer 38 and the fourth metal layer 40. The ion distributing layer 30 and the polysilicon layer 32 are formed most based electrical devices in the core circuit 24 such as transistors and diodes. The terminals of above electrical devices (the transistor and the diode) can be connected by the first metal layer 34 and the second metal layer 36. The power source ring 20 and the grounding ring 22 are located on the fourth metal layer 40.

Figure 3:
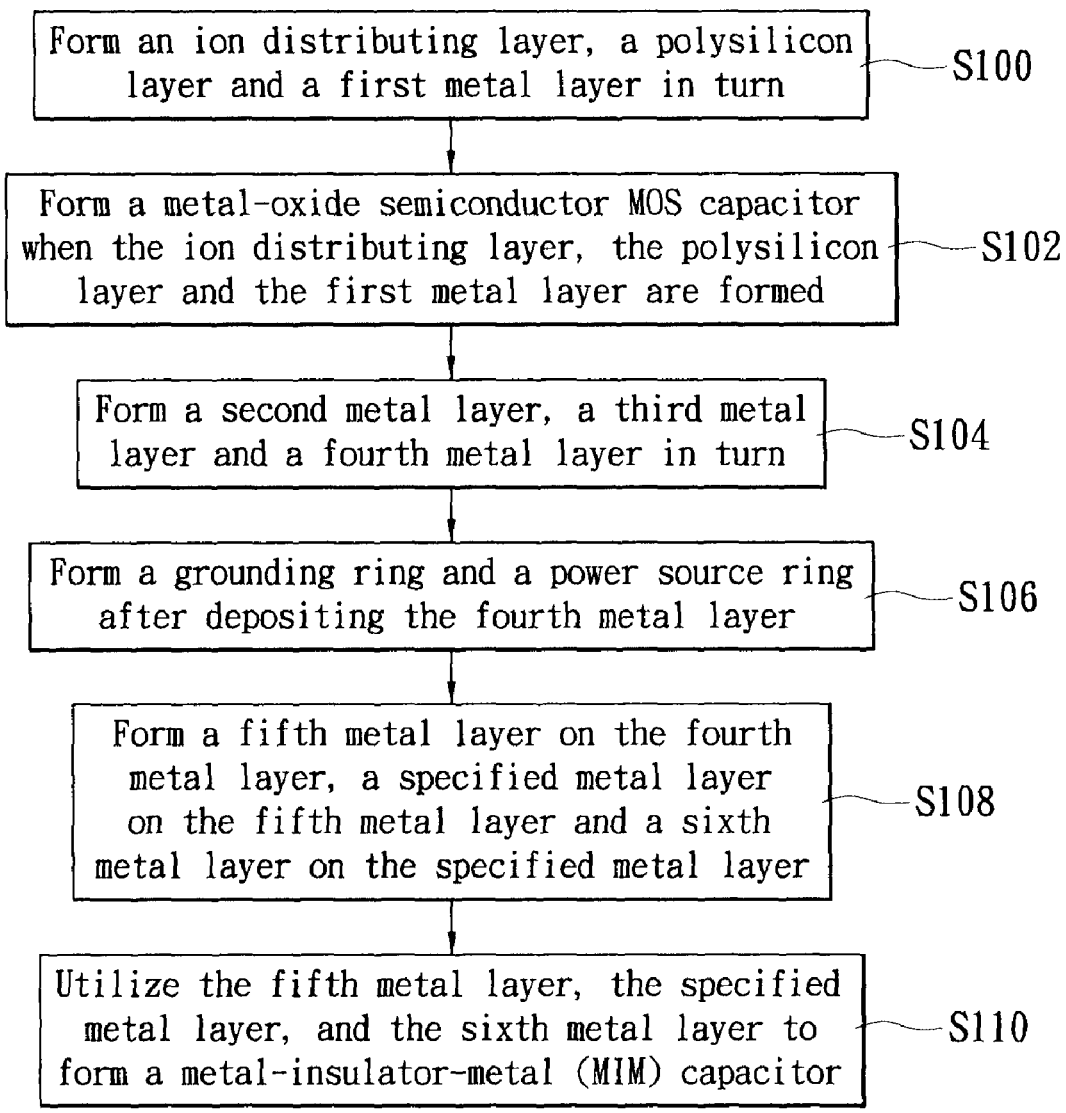
FIG. 3 is a flow chart of the manufacturing method for the embedded memory circuit of an embodiment of the present invention.

Reference is made to FIGS. 2B and 3. FIG. 3 is a flow chart of the manufacturing method for the embedded memory circuit of an embodiment of the present invention. The present invention utilizes the initial design of the circuit layout and the embedded memory structure to design the metal-insulator-metal capacitor (MIM) deposited on the core circuit of the embedded memory and the MOS capacitor (MOSCAP) below the grounding ring and the power source ring. Thereby, the reliability of the embedded memory for the unstable power source is improved. The manufacturing process for the embedded memory is described as below.

Firstly, an ion distributing layer 30, a polysilicon layer 32 and a first metal layer 34 are formed (S100) in turn. Because the location of the MOS capacitor 28 has been mapped out in the initial circuit layout, the MOS capacitor 28 also is formed at the same time when the ion distributing layer 30, the polysilicon layer 32 and the first metal layer 34 are taken shape (S102). Next, a second metal layer 36, a third metal layer 38 and a fourth metal layer 40 are formed in turn (S104). The fourth metal layer 40 is patterned to form a grounding ring 22 and a power source ring 20 (S106). At this time, from a top view, the embedded memory structure is mapped out into three parts including the core circuit, the grounding ring and the power source ring, and the grounding ring and the power source ring surround around the core circuit.

The core circuit is formed by stacking the ion distributing layer 30, the polysilicon layer 32, the first metal layer 34, the second metal layer 36, the third metal layer 38 and the fourth metal layer 40. The ion distributing layer 30 and the polysilicon layer 32 are formed most based electrical devices in the core circuit 24 such as transistors and diodes. The terminals of above electrical devices (the transistors and the diodes) can be connected together by the first metal layer 34 and the second metal layer 36. The additional space (location), including three layer structure of the ion distributing layer 30, the polysilicon layer 32 and the first metal layer 34, below the grounding ring 22 and the power source ring 20 planned in advance is utilized to be the MOS capacitor 28.

Next, a fifth metal layer 42 is deposited on the fourth metal layer 40, a specified metal layer 260 is formed on the fifth metal layer 42, and a sixth metal layer 44 is formed on the specified metal layer 260 (S108). This means that the specified metal layer 260 is located between the fifth metal layer 42 and the sixth metal layer 44 so that the fifth metal layer 42, the specified metal layer 260 and the sixth metal layer 44 compose of a metal-insulator-metal capacitor (S110). The specified metal layer 260 is close to the fifth metal layer 42. Thereby, the MOS capacitor 28 is added below the power source ring 20 and the grounding ring 22 located at the rim of the embedded memory, and the metal-insulator-metal capacitor 26 is added above the core circuit of the embedded memory to increase the stability of the embedded memory for the power source.

The present invention adds the MOS capacitor 28 and the metal-insulator-metal capacitor 26 into the embedded memory of the SOC chip. Therefore, the present invention does not need to substantially change the layout of the embedded memory just to utilize the three layer structure (the ion distributing layer 30, the polysilicon layer 32, the first metal layer 34) and between the fifth metal layer 42 and the sixth metal layer 44 to dispose the MOS capacitor 28 and the metal-insulator-metal capacitor 26 on the additional space respectively. Thereby, the stability of the power source ring 20 is enhanced, and the voltage of the embedded memory is stabilized. Furthermore, the power source for the peripheral circuit of the embedded memory is also stabilized, and the reliability of the SOC is enhanced.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An embedded memory device, comprising:
a core circuit surrounded by a grounding ring and a power source ring;
a metal-oxide-semiconductor (MOS) capacitor located below the power source ring and the grounding ring of the core circuit, said MOS capacitor being electrically connected with the power source ring and the grounding ring, wherein the MOS capacitor is coupled in parallel with the core circuit, and wherein the MOS capacitor is composed of an ion distributing layer, a polysilicon layer, and a metal layer, and is located on an additional space below the power source ring and the grounding ring; and
a metal-insulator-metal (MIM) capacitor located above the core circuit, said MIM capacitor being connected with the power source ring and the grounding ring, wherein the MIM capacitor is coupled in parallel with the core circuit and the MOS capacitor;
wherein the stability of the power source is enhanced by utilizing the MOS capacitor and the MIM capacitor.

2. The embedded memory device as claimed in claim 1, wherein said polysilicon layer is disposed on said ion distributing layer.

3. The embedded memory device as claimed in claim 1, further comprising:
a first metal layer disposed on the polysilicon layer;
a second metal layer disposed on the first metal layer;
a third metal layer disposed on the second metal layer;
a fourth metal layer disposed on the third metal layer;
a fifth metal layer disposed on the fourth metal layer;
a specified metal layer disposed on the fifth metal layer; and
a sixth metal layer disposed on the specified metal layer.

4. The embedded memory device as claimed in claim 3, wherein said metal layer of said MOS capacitor is selected from a group consisting of said first metal layer, said second metal layer, said third metal layer, and said fourth metal layer, said fifth metal layer, and said sixth metal layer disposed on said polysilicon layer.

5. The embedded memory device as claimed in claim 3, wherein the core circuit is formed by stacking the ion distributing layer, the polysilicon layer, the first metal layer, the second metal layer, the third metal layer and the fourth metal layer.

6. The embedded memory device as claimed in claim 3, wherein the power source ring and the grounding ring are patterned on the fourth metal layer.

7. The embedded memory device as claimed in claim 3, wherein the metal insulator metal MIM capacitor is composed of the fifth metal layer, the specified metal layer and the sixth metal layer.

8. A manufacturing method for an embedded memory, comprising the steps of:

forming sequentially an ion distributing layer, a polysilicon layer, and a first metal layer;

forming sequentially a second metal layer, a third metal layer and a fourth metal layer above the first metal layer;

forming a grounding ring and a power source ring on the fourth metal layer;

forming a fifth metal layer on the fourth metal layer, a specified metal layer on the fifth metal layer, and a sixth metal layer on the specified metal layer;

utilizing the ion distributing layer, the polysilicon layer and one of said first, second, third, and fourth metal layers to form a metal-oxide-semiconductor (MOS) capacitor, wherein the MOS capacitor is located on an additional space below the power source ring and the grounding ring; and utilizing the fifth metal layer, the specified metal layer, and the sixth metal layer to form a metal-insulator-metal capacitor.

9. The manufacturing method as claimed in claim 8, wherein said polysilicon layer is formed on said ion distributing layer.

10. The manufacturing method for an embedded memory device as claimed in claim 8, wherein the metal-insulator-metal capacitor is formed above the fourth metal layer.

* * * * *